United States Patent
Song et al.

(10) Patent No.: US 10,435,809 B2
(45) Date of Patent: Oct. 8, 2019

(54) APPARATUS FOR GROWING SINGLE CRYSTALLINE INGOT AND METHOD FOR GROWING SAME

(71) Applicant: SK SILTRON CO., LTD., Gumi-si, Gyeongsangbuk-do (KR)

(72) Inventors: Do-Won Song, Gumi-si (KR); Hong-Woo Lee, Gumi-si (KR); Sang-Hee Kim, Gumi-si (KR); Ho-Jun Lee, Gumi-si (KR); Jung-Ryul Kim, Gumi-si (KR)

(73) Assignee: SK Siltron Co., Ltd., Gumi-Si (KR)

( * ) Notice: Subject to any disclaimer, the term of this patent is extended or adjusted under 35 U.S.C. 154(b) by 0 days.

(21) Appl. No.: 15/752,719

(22) PCT Filed: Jun. 7, 2016

(86) PCT No.: PCT/KR2016/006008
§ 371 (c)(1),
(2) Date: Feb. 14, 2018

(87) PCT Pub. No.: WO2017/030275
PCT Pub. Date: Feb. 23, 2017

(65) Prior Publication Data
US 2018/0237939 A1    Aug. 23, 2018

(30) Foreign Application Priority Data

Aug. 19, 2015  (KR) .................... 10-2015-0116605

(51) Int. Cl.
*C30B 15/22*    (2006.01)
*C30B 15/20*    (2006.01)
(Continued)

(52) U.S. Cl.
CPC ............. *C30B 15/22* (2013.01); *C30B 15/20* (2013.01); *C30B 15/305* (2013.01); *C30B 29/06* (2013.01); *C30B 30/04* (2013.01)

(58) Field of Classification Search
CPC combination set(s) only.
See application file for complete search history.

(56) References Cited

U.S. PATENT DOCUMENTS

2008/0302294 A1* 12/2008 Ohkubo ................ C30B 15/305
117/13

FOREIGN PATENT DOCUMENTS

JP    H01282185 A    11/1989
JP    2006069841 A    3/2006
(Continued)

OTHER PUBLICATIONS

Machine translation of JP2007204312.*
(Continued)

*Primary Examiner* — Erin F Bergner
(74) *Attorney, Agent, or Firm* — Lewis Roca Rothgerber Christie LLP

(57) ABSTRACT

The present invention relates to an apparatus for growing a single crystal ingot capable of uniformly controlling an oxygen concentration in a longitudinal direction and a radial direction of a single crystal ingot by uniformly maintaining a convection pattern on a silicon melt interface, and a method for growing the same. In an apparatus for growing a single crystal ingot and a method for growing the same according to the present invention, a horizontal magnet is positioned to be movable up and down by a magnet moving unit around a crucible, so that a maximum gauss position (MGP) is positioned to be higher than the silicon melt interface and simultaneously, a rate of increase in the MGP is controlled to 3.5 mm/hr to 6.5 mm/hr, and thus it possible to secure simplicity and symmetry of convection on the silicon melt interface. Accordingly, in the present invention, it is possible to reduce an Oi deviation and a BMD deviation in a longitudinal direction and a radial direction of a single crystal ingot, thereby improving quality.

7 Claims, 11 Drawing Sheets

(51) Int. Cl.
   *C30B 29/06* (2006.01)
   *C30B 30/04* (2006.01)
   *C30B 15/30* (2006.01)

(56) References Cited

FOREIGN PATENT DOCUMENTS

| | | | | |
|---|---|---|---|---|
| JP | 2007204312 | * | 8/2007 | ............ C30B 29/06 |
| JP | 2008214118 | A | 9/2008 | |
| JP | 2010024120 | A | 2/2010 | |
| JP | WO2009025339 | A1 | 11/2010 | |
| KR | 10-2007-0013214 | A | 1/2007 | |
| KR | 10-2011-0080498 | A | 7/2011 | |
| KR | 10-2011-0087035 | A | 8/2011 | |
| KR | 10-2011-0112790 | A | 10/2011 | |
| KR | 10-2013-0080623 | A | 7/2013 | |

OTHER PUBLICATIONS

International Search Report for corresponding International Application No. PCT/KR2016/006008, dated Oct. 12, 2016, including part. Engl. Translation, 5pp.

JPO Office Action dated Dec. 4, 2018, for corresponding JP Application No. JP 2018-508685 (2 pages).

* cited by examiner

FIG. 3
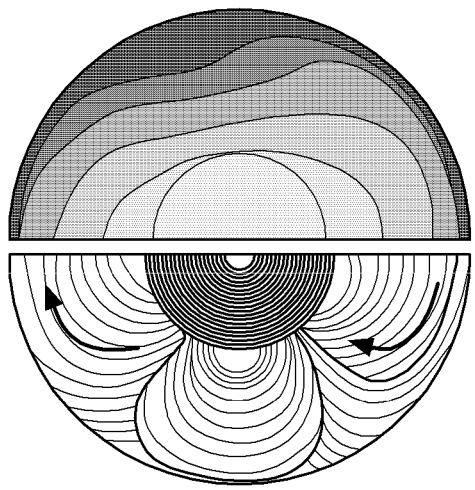
COMPARATIVE EXAMPLE (-MGP)
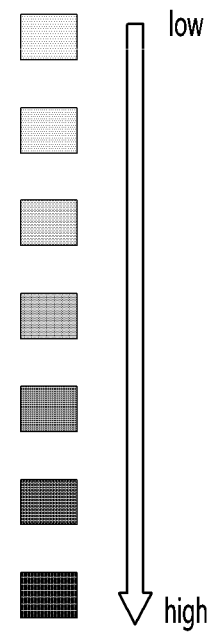
TEMPERATURE
low
high
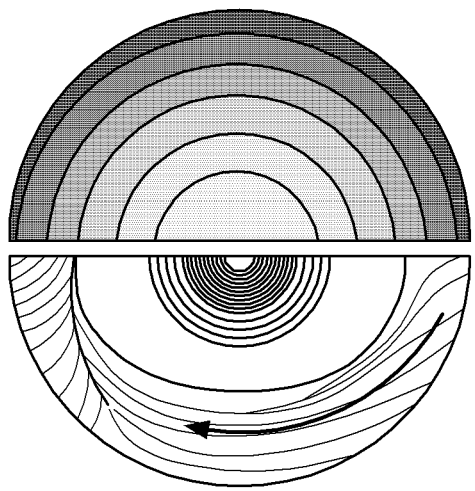
EXPERIMENTAL EXAMPLE (+MGP)

FIG. 6
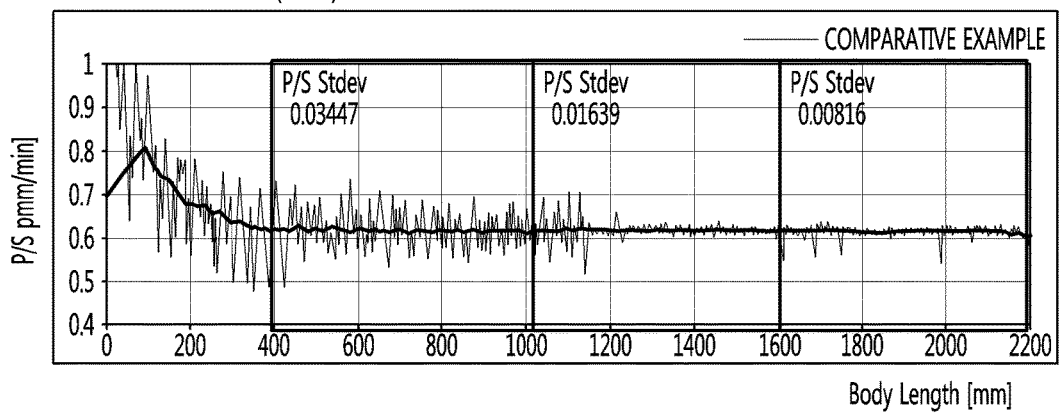
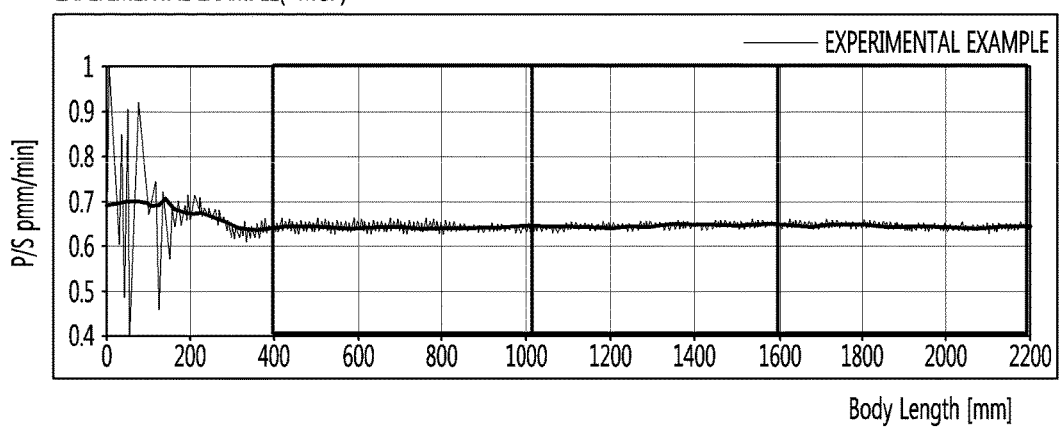

FIG. 10
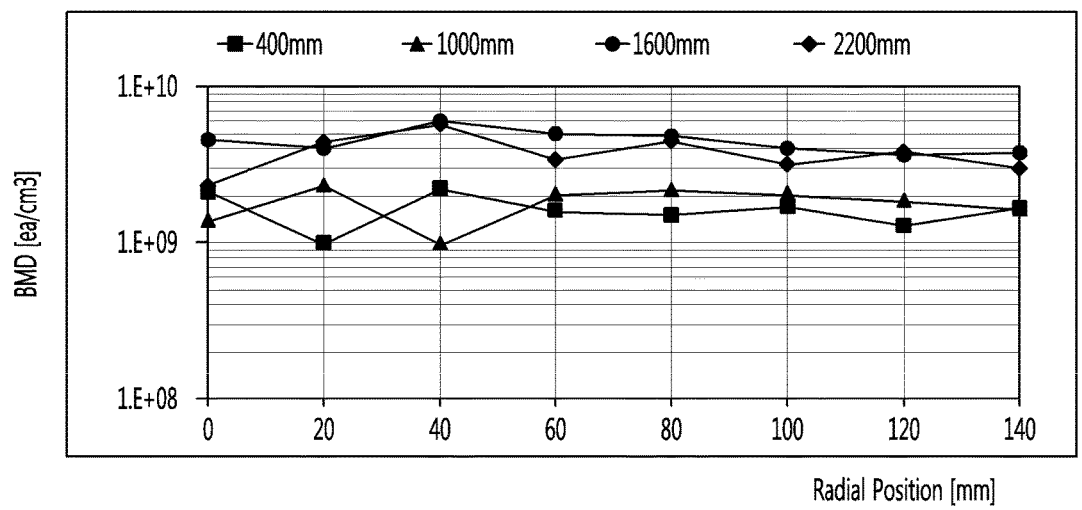
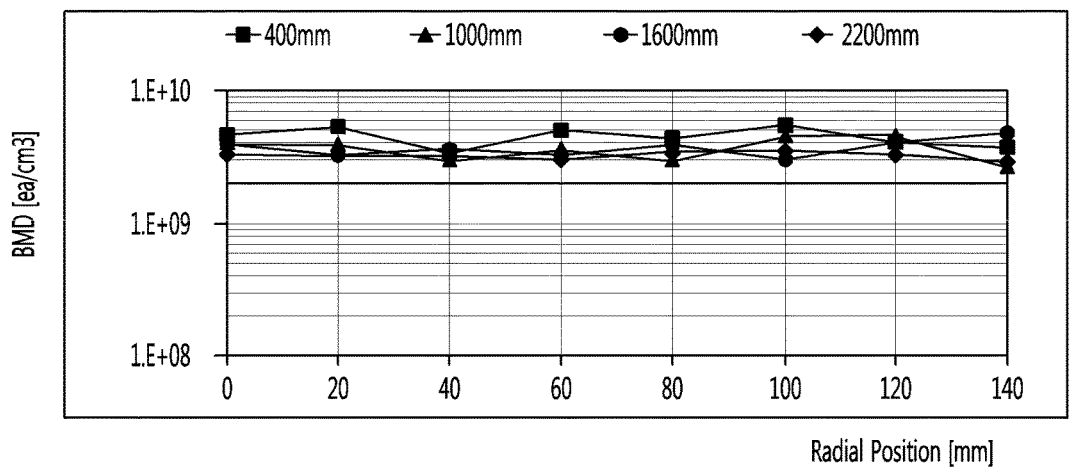

FIG. 11

| Body length (mm) | SOLIDIFICATION RATE | ΔOi (COMPARATIVE EXAMPLE-EXPERIMENTAL EXAMPLE) |
|---|---|---|
| 500 | 20% | 1.35 |
| 1000 | 40% | 1.4 |
| 1500 | 60% | 0.28 |
| 2000 | 80% | 0.5 |

APPARATUS FOR GROWING SINGLE CRYSTALLINE INGOT AND METHOD FOR GROWING SAME

CROSS-REFERENCE TO RELATED APPLICATION(S)

This application is a National Phase Patent Application and claims priority to and the benefit of International Application Number PCT/KR2016/006008, filed on Jun. 7, 2016, which claims priority to Korean Patent Application Number 10-2015-0116605, filed on Aug. 19, 2015, the entire contents of all of which are incorporated herein by reference.

TECHNICAL FIELD

The present invention relates to an apparatus for growing a single crystal ingot capable of uniformly controlling an oxygen concentration in a longitudinal direction and a radial direction of a single crystal ingot by uniformly maintaining a convection pattern on a silicon melt interface, and a method for growing the same.

BACKGROUND ART

A semiconductor is manufactured through steps of fabricating a wafer, injecting predetermined ions into such a wafer, forming a circuit pattern, and the like. At this point, in order to fabricate the wafer, a single crystal silicon should be grown in an ingot form. For this, the Czochralski (CZ) method may be applied.

Currently, a quartz crucible is used to accommodate silicon melt, which is melted in a method for fabricating a single crystal ingot by the CZ method. Such a quartz crucible is converted into SiOx by being dissolved in the melt accompanied by reaction with the silicon melt. The SiOx is mixed into the ingot and forms bulk micro defects (BMD) or the like, which acts as a gathering site for metal impurities during a semiconductor process or causes various defects and segregation, which may adversely affect yield of the semiconductor device.

In order to control an oxygen concentration in such a single crystal ingot, there is a method for largely changing a hot zone (H/Z) in a crystal growth furnace in advance. For example, there has been widely discussed on a method for controlling a dissolution rate of the quartz crucible by adjusting a length of a heater, adjusting a slit or the like.

In addition, there is a method for controlling the oxygen concentration by adjusting a rotational speed of the single crystal ingot, a rotational speed of the quartz crucible, and argon or pressure in the growth furnace.

Further, there is another method for controlling the oxygen concentration through melt convection using a magnetic field.

Japanese Patent Application No. 2008-214118 discloses a method for controlling an oxygen concentration in a longitudinal direction of a silicon single crystal in which a correlation between a magnetic field center position and an oxygen concentration is obtained and a single crystal is pulled up while controlling the magnetic field center position.

However, according to the related art, when the magnetic field center position moves to a silicon melt interface, the oxygen concentration is largely changed by forming a convection pattern in which a flow of the melt is complicated, and thus there is a problem that the oxygen concentration is not uniform in a radial direction of the single crystal ingot.

DISCLOSURE

Technical Problem

The present invention is directed to solving the above described problems in the related art and providing an apparatus for growing a single crystal ingot capable of uniformly controlling an oxygen concentration in a longitudinal direction and a radial direction of a single crystal ingot by uniformly maintaining a convection pattern on a silicon melt interface, and a method for growing the same.

Technical Solution

According to the present invention, there is provided an apparatus for growing a single crystal ingot, including: a crucible configured to accommodate silicon melt in which a single crystal ingot grows; a horizontal magnet provided around the crucible and configured to form a magnetic field in a horizontal direction; and a magnet moving unit configured to move the horizontal magnet in a vertical direction, wherein the magnet moving unit positions a maximum gauss position (MGP) of the horizontal magnet to be higher than a solid-liquid interface of the silicon melt accommodated in the crucible and controls a rate of increase in the MGP to be in the range of 3.5 mm/hr to 6.5 mm/hr.

In addition, according to the present invention, there is provided a method for growing a single crystal ingot, including: a first step of growing a single crystal ingot from a silicon melt interface; a second step of forming a magnetic field in a horizontal direction in silicon melt in which the single crystal ingot is grown in the first step; and a third step of positioning a maximum gauss position (MGP) of the magnetic field formed in the second step to be higher than the silicon melt interface, and controlling a rate of increase in the MGP to be in the range of 3.5 mm/hr to 6.5 mm/hr.

Advantageous Effects

In an apparatus for growing a single crystal ingot and a method for growing the same according to the present invention, a horizontal magnet is positioned to be movable up and down by a magnet moving unit around a crucible, and a maximum gauss position (MGP) is positioned higher than a silicon melt interface and simultaneously, a rate of increase in the MGP is controlled to be in the range of 3.5 mm/hr to 6.5 mm/hr, and thus it possible to secure simplicity and symmetry of convection on the silicon melt interface.

Accordingly, in the present invention, it is possible to reduce an Oi deviation and a BMD deviation in a longitudinal direction and a radial direction of the single crystal ingot, thereby improving quality.

DESCRIPTION OF DRAWINGS

FIG. 3 is graphs illustrating a temperature and a flow velocity of a silicon melt interface according to a conventional comparative example and an embodiment of the present invention.

FIG. 6 is graphs illustrating a pulling speed (P/S) deviation according to sections by a length of a single crystal ingot according to a conventional comparative example and an embodiment of the present invention.

FIG. 10 is graphs in which a BMD is illustrated in a plane obtained by cutting a single crystal ingot in a radial direction according to an embodiment of the present invention.

FIG. 11 is a table illustrating a ΔOi whether a rate of increase in MCP is applied by a solidification rate of silicon melt.

MODES OF THE INVENTION

Hereinafter, embodiments will be described in detail with reference to the accompanying drawings. However, the scope of the spirit of the present invention may be determined from the matters disclosed in the embodiments, and the spirit of the present invention of the embodiments include practical modifications such as addition, deletion, modification, and the like of components to the following proposed embodiments.

Figure 1:
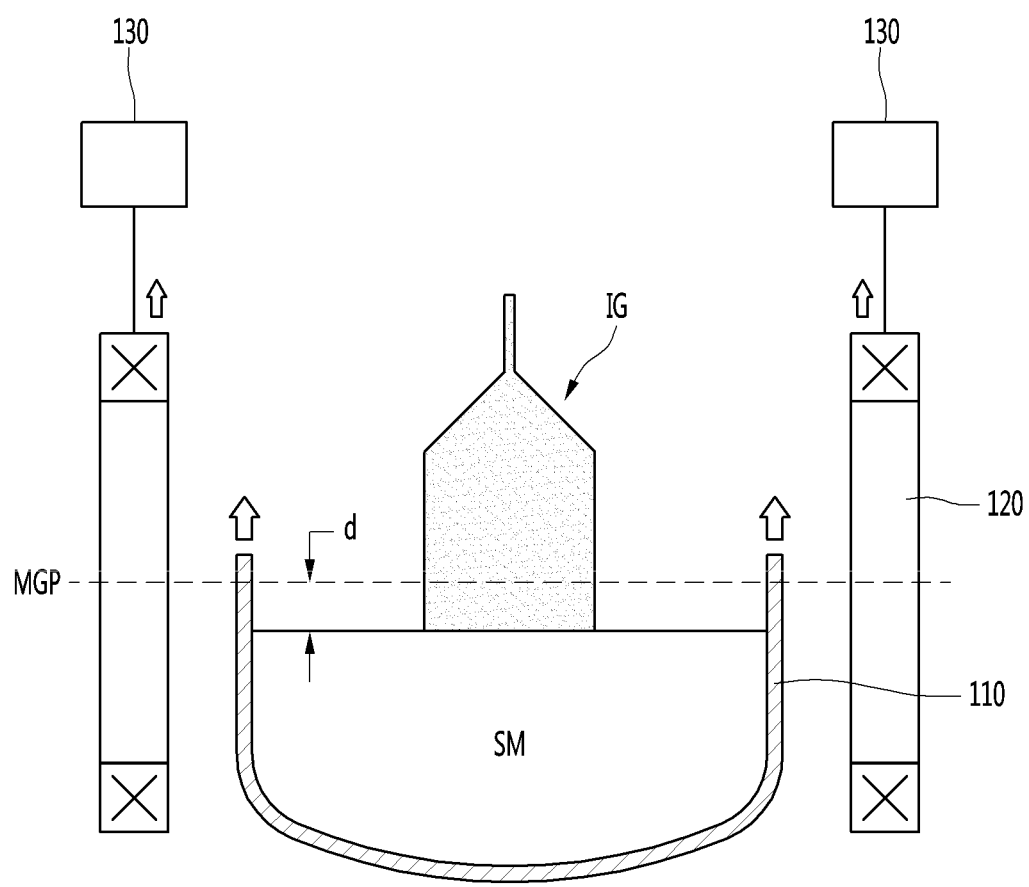
FIG. 1 is a schematic view illustrating an embodiment of an apparatus for growing a single crystal ingot according to the present invention.

FIG. 1 is a schematic view illustrating an embodiment of an apparatus for growing a single crystal ingot according to the present invention.

As shown in FIG. 1, the apparatus for growing a single crystal ingot of the present invention includes a crucible 110 in which silicon melt is accommodated, a horizontal magnet 120 configured to form a magnetic field around the crucible 110, and a magnet moving unit 130 configured to move up and down the horizontal magnet 120.

The crucible 110 uses a quartz crucible which does not affect components of the silicon melt even if heated to a high temperature, and the crucible 110 is installed not only so as to be rotatable around a rotation axis, but also so as to be movable vertically.

The horizontal magnet 120 is installed at a predetermined interval around the crucible 110 and forms a magnetic field in a horizontal direction inside the silicon melt. An axial center of the horizontal magnet 120 becomes a maximum gauss position (MGP), which generates a maximum magnetic field.

In an embodiment, it is preferable that the MGP is positioned at least 150 mm higher than a silicon melt interface.

The magnet moving unit 130 may be configured to move up and down the horizontal magnet 120 in a state in which the horizontal magnet 120 is suspended, and may control a rate of increase in the MGP.

In an embodiment, it is preferable that the magnet moving unit 130 controls a rate of increase in the MGP to 3.5 to 6.5 mm/hr when a solidification rate of the silicon melt is 40% or less.

Figure 2:
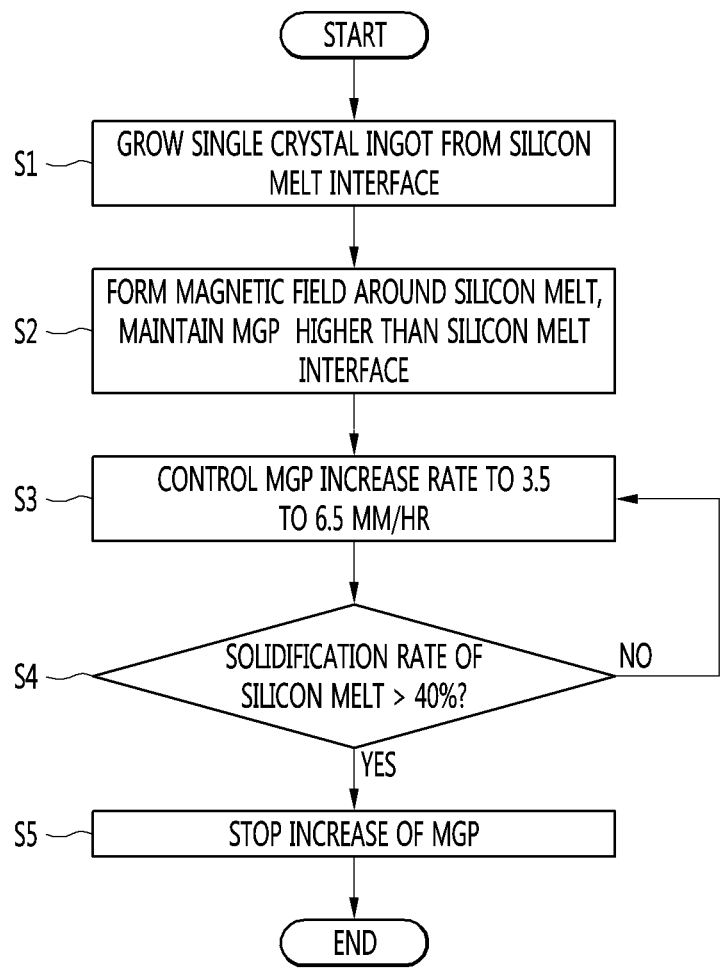
FIG. 2 is a view illustrating an embodiment of a method for growing a single crystal ingot according to the present invention.

FIG. 2 is a view illustrating an embodiment of a method for growing a single crystal ingot according to the present invention.

The method for growing a single crystal ingot of the present invention grows a single crystal ingot from a silicon melt interface as shown in FIG. 2 (see S1).

In detail, when a seed suspended in a wire is immersed in silicon melt accommodated in a crucible, a single crystal grows in a radial direction around the seed as the crucible and the seed rotate in opposite directions, and the single crystal grows in an axial direction as the wire is pulled up.

Of course, the silicon melt is reduced as the single crystal ingot grows, and the crucible is moved upward to maintain positions of the single crystal ingot and the silicon melt interface at a predetermined height.

At this point, when the crucible and the seed are rotated in opposite directions, two convection patterns are formed in opposite directions at a circumferential portion and a center portion, and a boundary layer is formed around the single crystal ingot to divide the two convection patterns.

As describe above, while the single crystal ingot is growing, a magnetic field is formed around the silicon melt, an MGP is positioned higher than the silicon melt interface, and simultaneously, a rate of increase in the MGP is controlled in the range of 3.5 to 6.5 mm/hr (see S2 and S3).

In detail, when the MGP is positioned higher than the silicon melt interface, a natural convection phenomenon is suppressed in the silicon melt as a centrifugal force mainly acts, the two convection patterns formed in opposite directions at the circumferential portion and the center portion are maintained as they are, and simultaneously, new silicon melt inflowing into the boundary layer is suppressed, so that a temperature interference influencing on a meniscus between the silicon melt and the single crystal ingot may be reduced, thereby stably maintaining a single crystal growth.

Preferably, when a rate of increase in the MGP is controlled in the range of 3.5 to 6.5 mm/hr, an Oi concentration deviation in a radial direction of the single crystal ingot is uniformly formed to 0.04 ppma or less, and simultaneously, an Oi concentration deviation in an axial direction of the single crystal ingot is set to 0.01 ppma or less.

More preferably, when a rate of increase in the MGP is controlled to 5 mm/hr, the Oi concentration deviation in the axial direction of the single crystal ingot may be further lowered, and thus quality of the single crystal ingot can be further improved.

However, when a solidification rate of the silicon melt exceeds 40%, an increase of MGP is stopped (see S4 and S5).

In general, an amount of silicon melt remaining in the crucible decreases as the single crystal ingot grows, and an influence of the magnetic field acting on the silicon melt also decreases.

Accordingly, when a solidification rate of the silicon melt exceeds 40%, since an effect of controlling a rate of increase in the MGP is small even though an increase rate of the MGP is controlled according to an embodiment of the present invention, it is preferable that an increase of the MGP is stopped, and a position of the MGP is controlled to be 150 mm higher than the silicon melt interface.

FIG. 3 is graphs illustrating a temperature and a flow velocity of a silicon melt interface according to a conventional comparative example and an embodiment of the present invention.

Reviewing a conventional comparative example, −MGP in which the MGP maintains a fixed position at a position 230 mm lower than the silicon melt interface, a temperature distribution at a solid-liquid interface is shown as non-uniform and also a convection pattern is shown as complicated.

On the other hand, reviewing an embodiment of the present invention, +MGP in which the MGP increases at a predetermined increase rate at a position 150 mm higher than the silicon melt interface, a temperature distribution at the solid-liquid interface is shown as uniform and also the convection pattern is shown as symmetrical as well as simple.

Accordingly, according to an embodiment of the present invention, it can be confirmed that, when the MGP is formed at a position higher than the silicon melt interface and maintained at a predetermined increase rate, the Oi concentration is uniformly formed in a radial direction of the single crystal ingot.

Figure 4:
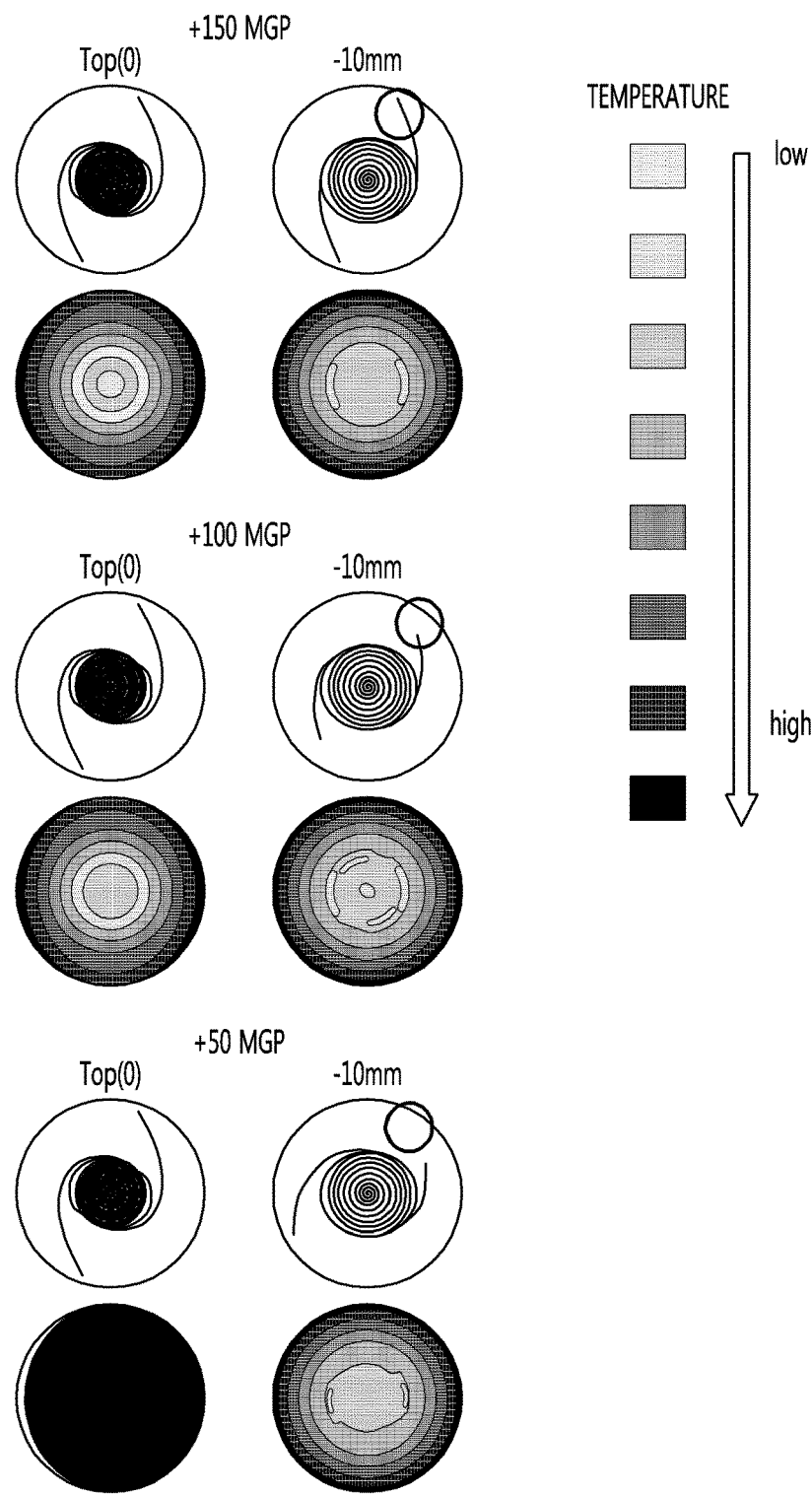
FIG. 4 is graphs illustrating a temperature and a flow velocity of silicon melt at an upper surface and −10 mm point on the basis of a silicon melt interface according to each embodiment of the present invention.

FIG. 4 is graphs illustrating a temperature and a flow velocity of a silicon melt at an upper surface and −10 mm point on the basis of a silicon melt interface according to each embodiment of the present invention.

Reviewing each embodiment of the present invention, +150 MGP, +100 MGP, and +50 MGP in which the MGP increases at a predetermined increase rate from 150 mm, 100 mm, and 50 mm higher than the silicon melt interface, as the MGP is close to the silicon melt interface, a shape of the boundary layer between the convection pattern of the circumferential portion and the convection pattern of the center portion is changed to an ellipse, and a node in which the silicon melt is introduced tends to be weakened.

As a result, even though the MGP is formed higher than the silicon melt interface, as the MGP is close to the silicon melt interface, a possibility that oxygen eluted in the silicon melt flows into a super cooled region is reduced by the convection pattern, and the oxygen is not uniformly introduced into the single crystal, and thus it difficult to control the oxygen deviation in a plane of the single crystal ingot.

Accordingly, according to an embodiment of the present invention, when the +150 MGP or more is maintained, it is possible to control an abrupt oxygen change (bifurcation) according to a change of the boundary layer and to uniformly control the oxygen deviation in a radial direction of the single crystal ingot.

Figure 5:
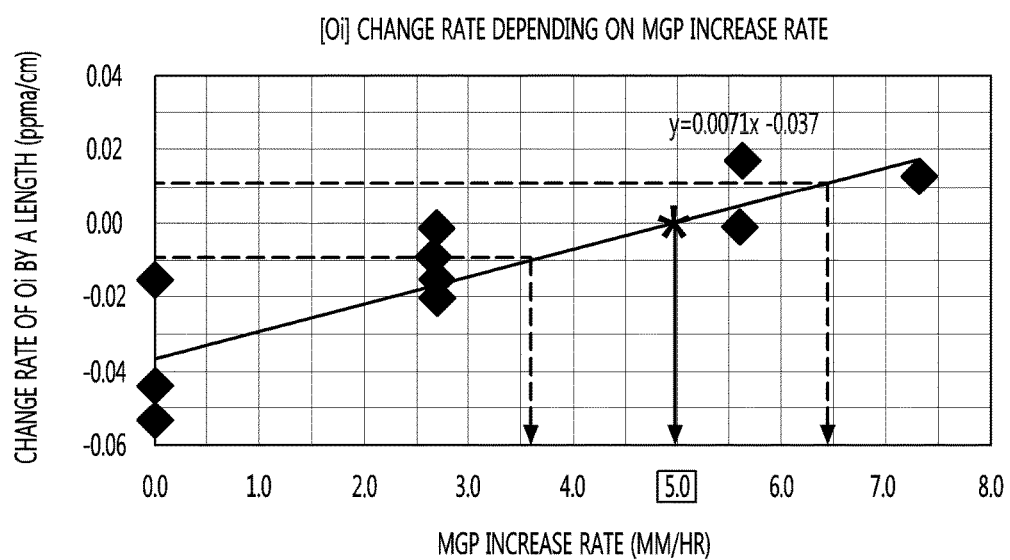
FIG. 5 is a graph illustrating an Oi change rate per length of a single crystal ingot with respect to a MGP increase rate according to an embodiment of the present invention.

FIG. 5 is a graph illustrating an Oi change rate per length of a single crystal ingot with respect to a MGP increase rate according to an embodiment of the present invention.

According to an embodiment of the present invention, when an increase rate of the MGP is changed at a position higher than the silicon melt interface, a change rate of the Oi by a length of the single crystal ingot is varied.

At this point, when an increase rate of the MGP is controlled in the range of 3.5 to 6.5 mm/hr, a change rate of the Oi by a length of the single crystal ingot is shown as within ±0.01 ppma/cm. On the other hand, when an increase rate of the MGP is controlled to be out of the above range, a change rate of the Oi by a length of the single crystal ingot length is shown as larger.

In particular, when an increase rate of the MGP is controlled to 5 mm/hr, it can be confirmed that a change rate of the Oi by a length of the single crystal ingot is shown as zero.

Accordingly, according to an embodiment of the present invention, when an increase rate the MGP is controlled in the range of 3.5 to 6.5 mm/hr in +MGP, an Oi concentration in a longitudinal direction of the single crystal ingot may be controlled to be constant, and thus a single crystal ingot and a wafer of desired quality can be produced.

FIG. 6 is graphs illustrating a pulling speed (P/S) deviation according to sections by a length of a single crystal ingot according to a conventional comparative example and an embodiment of the present invention.

Reviewing a conventional comparative example, −MGP in which the MGP maintains a fixed position at a position 230 mm lower than the silicon melt interface, a P/S change is shown as relatively large. On the other hand, reviewing an embodiment of the present invention, +MGP in which the MGP increases at a predetermined increase rate at a position 150 mm higher than the silicon melt interface, the P/S change is shown as relatively small.

In detail, reviewing the P/S deviation (Stdev) in the section of 400 to 1000 mm of the single crystal ingot in a longitudinal direction, a conventional comparative example is shown as 0.03447. On the other hand, an embodiment of the present invention is shown as 0.00727. It can be recognized that the embodiment of the present invention improves the P/S deviation by five times compared with the conventional comparative example.

In addition, reviewing the P/S deviation (Stdev) in the section of 1000 to 1600 mm of the single crystal ingot in a longitudinal direction, a conventional comparative example is shown as 0.01639. On the other hand, an embodiment of the present invention is shown as 0.0043. It can be recognized that the embodiment of the present invention improves the P/S deviation by four times compared with the conventional comparative example.

In addition, reviewing the P/S deviation (Stdev) in the section of 1600 to 2200 mm of the single crystal ingot in a longitudinal direction, a conventional comparative example is shown as 0.0816. On the other hand, an embodiment of the present invention is shown as 0.0039. It can be recognized that the embodiment of the present invention improves the P/S deviation by two times compared with the conventional comparative example.

As described above, the embodiment of the present invention improves the P/S deviation in a longitudinal direction of the single crystal ingot more than the conventional comparative example, which may suppress a direct melt inflow near a solid-liquid interface and may reduce a temperature interference to the meniscus, thereby stably growing a single crystal ingot.

Figure 7:
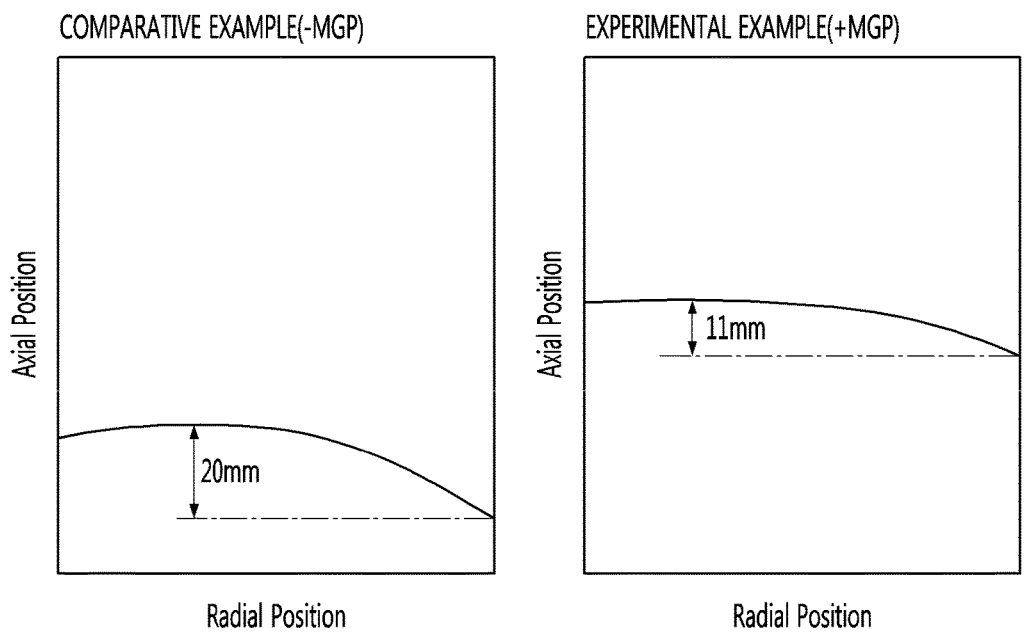
FIG. 7 is views illustrating shapes of a single crystal ingot and a silicon melt interface according to a conventional comparative example and an embodiment of the present invention.

FIG. 7 is views illustrating shapes of a single crystal ingot and a silicon melt interface according to a conventional comparative example and an embodiment of the present invention.

Reviewing a conventional comparative example, −MGP in which the MGP maintains a fixed position at a position 230 mm lower than the silicon melt interface, a center portion of a solid-liquid interface is shown as 20 mm higher than an outer peripheral portion. On the other hand, reviewing an embodiment of the present invention, +MGP in which the MGP increases at a predetermined increase rate at a position 150 mm higher than the silicon melt interface, a center portion of the solid-liquid interface is shown as 10 mm higher than an outer peripheral portion.

As described above, it can be confirmed that as the P/S deviation in a longitudinal direction of the single crystal ingot is improved in the embodiment of the present invention compared with the conventional comparative example, a temperature change is reduced at a solid-liquid interface, and as the solid-liquid interface becomes flat, an Oi deviation is improved in a radial direction of the ingot.

Figure 8:
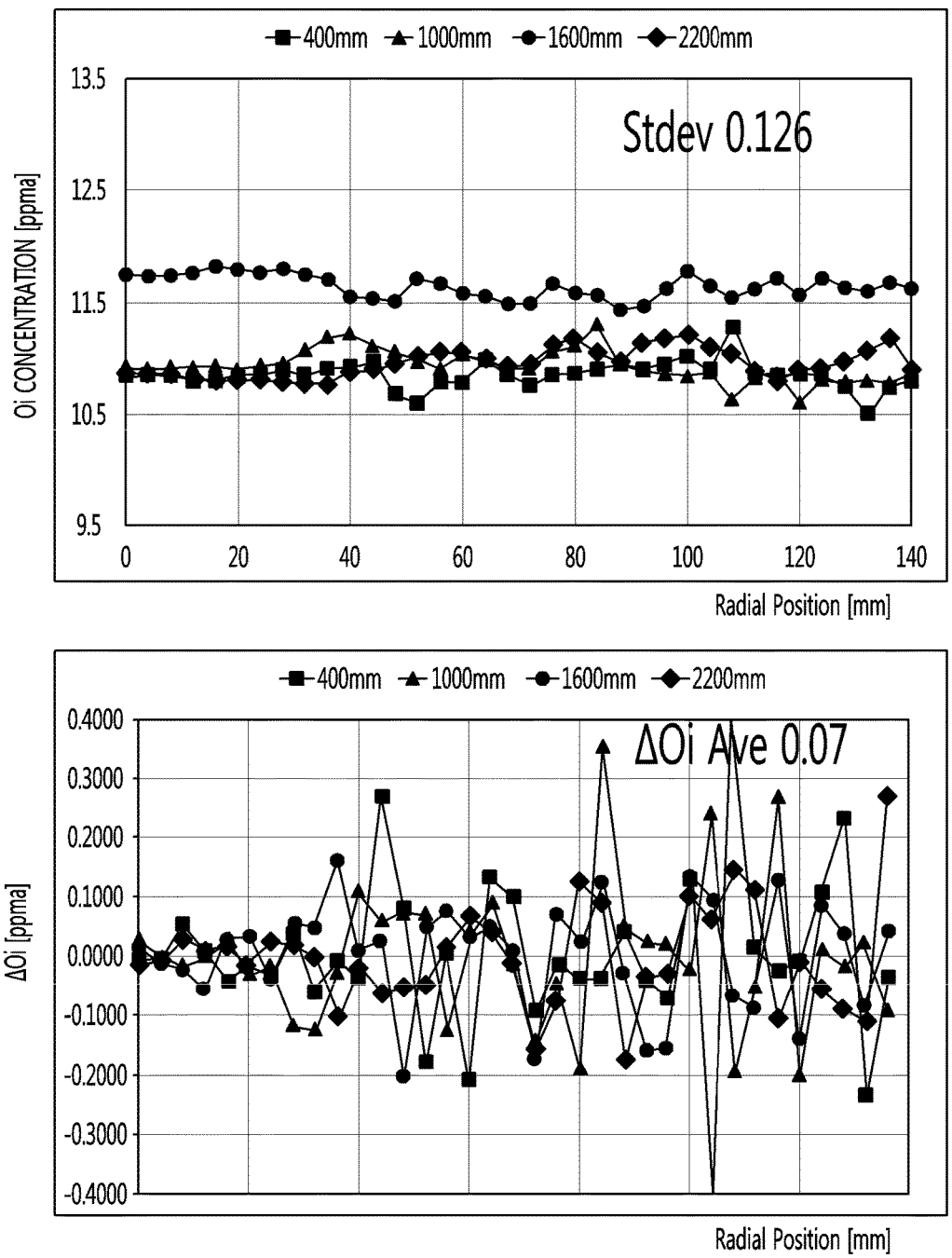
FIG. 8 is graphs illustrating an Oi concentration deviation and a ΔOi concentration deviation in a plane obtained by cutting a single crystal ingot in a radial direction according to a conventional comparative example and an embodiment of the present invention.

FIG. 8 is graphs illustrating an Oi concentration deviation and a ΔOi concentration deviation in a plane obtained by cutting a single crystal ingot in a radial direction according to a conventional comparative example and an embodiment of the present invention.

Reviewing a conventional comparative example, −MGP in which the MGP maintains a fixed position at a position 230 mm lower than the silicon melt interface, an Oi concentration deviation (Oi Stdev) is shown as 0.126 in a plane of the single crystal ingot and an Oi concentration deviation (Oi Ave) is shown as 0.07 in a portion adjacent to the plane of the single crystal ingot.

On the other hand, reviewing an embodiment of the present invention, +MGP in which the MGP increases at a predetermined increase rate at a position 150 mm higher than the silicon melt interface, an Oi concentration deviation (Oi Stdev) is shown as 0.035 in a plane of the single crystal ingot and an Oi concentration deviation (Oi Ave) is shown as 0.03 in a portion adjacent to the plane of the single crystal ingot.

As described above, it can be confirmed that the Oi deviation is greatly improved in the plane of the single crystal ingot of the embodiment of the present invention compared with the conventional comparative example.

Figure 9:
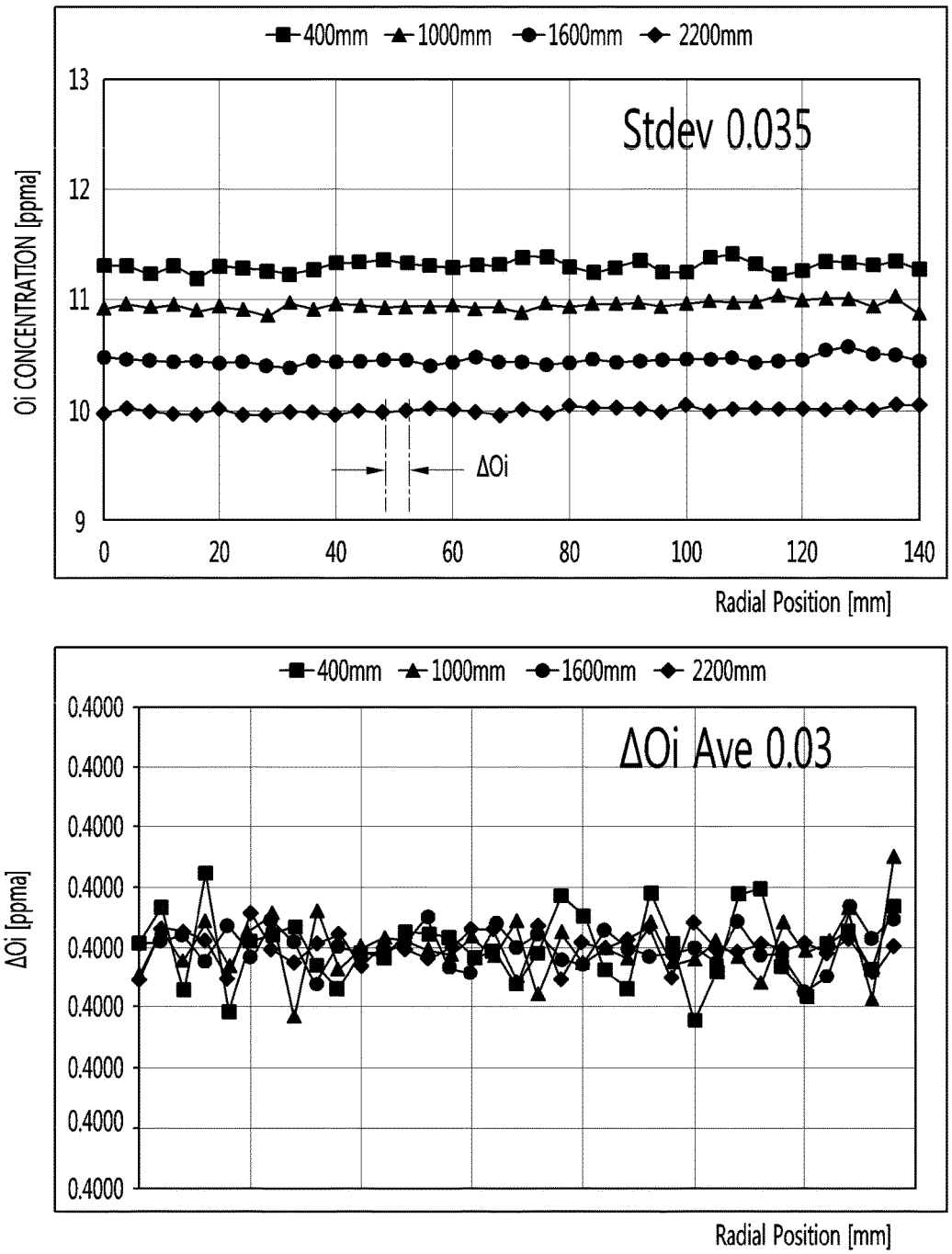
FIG. 9 is graphs in which a BMD is illustrated in a plane obtained by cutting a single crystal ingot in a radial direction according to a conventional comparative example.

FIGS. 9 and 10 are graphs illustrating BMDs in a plane obtained by cutting a single crystal ingot in a radial direction according to a conventional comparative example and an embodiment of the present invention.

Reviewing a conventional comparative example, −MGP in which the MGP maintains a fixed position at a position 230 mm lower than the silicon melt interface, the BMD range in a plane of the single crystal ingot at positions of 400 mm, 1000 mm, 1600 mm, and 2200 mm in a longitudinal direction of the single crystal ingot is shown as 2.3E+09 to 9.8E+09, 2.3E+09 to 1.0E+09, 5.0E+09 to 3.7E+09, and 5.8E+09 to 2.2E+09.

On the other hand, reviewing an embodiment of the present invention, +MGP in which the MGP increases at a predetermined increase rate at a position 150 mm higher than the silicon melt interface, the BMD range in a plane of the single crystal ingot at the positions of 400 mm, 1000 mm, 1600 mm, and 2200 mm in the longitudinal direction of the single crystal ingot is shown as E+09 to 3.37E+09, 4.60E+09 to 2.69E+09, 4.76E+09 to 3.04E+09, and 3.47E+09 to 2.90E+09.

As described above, it can be confirmed that a Log BMD deviation (Log BMD stdev) is calculated to be 0.063 or less in the embodiment of the present invention, and the BMD deviation is greatly improved in the plane of the single crystal ingot compared to the conventional comparative example.

FIG. 11 is a table illustrating a ΔOi whether a MGP increase rate is applied by a solidification rate of a silicon melt.

In a comparative example, the Oi concentration of the single crystal ingot is obtained while maintaining the MGP at a fixed position at a position 150 mm higher than the silicon melt interface. On the other hand, in an embodiment, the Oi concentration of a single crystal ingot is obtained in a state where the MGP increases at a predetermined increase rate at a position 150 mm higher than the silicon melt interface.

As the single crystal ingot grows from the silicon melt, a solidification rate increases and simultaneously, an amount of the silicon melt decreases. When a solidification rate is 40% or less, the ΔOi concentration is large in an embodiment and a comparative example, whereas when a solidification rate is more than 40%, the ΔOi concentration is small in an embodiment and a comparative example.

As described above, according to the embodiment of the present invention, when a solidification rate is 40% or less even when the MGP is positioned at +MGP higher than the silicon melt interface and simultaneously, a predetermined MGP increase rate is maintained, it can be confirmed that an effect of improving the Oi concentration is shown as significant.

That is, the Oi deviation is reduced as a body of the single crystal ingot grows, and in order to maximize an effect of improving the Oi deviation according to an embodiment of the present invention, it is preferable to apply at an initial stage in which a body of the single crystal ingot is grown, that is, at a solidification rate of 40% or less.

INDUSTRIAL APPLICABILITY

The present invention can be applied to an apparatus for growing a single crystal ingot and a method for growing the same, which can reduce an Oi deviation and a BMD deviation in a longitudinal direction and a radial direction of a single crystal ingot, thereby achieving higher quality of a single crystal ingot or wafer.

The invention claimed is:

1. An apparatus for growing a single crystal ingot, comprising:
   a crucible configured to accommodate silicon melt in which a single crystal ingot grows;
   a horizontal magnet provided around the crucible and configured to form a magnetic field in a horizontal direction, the magnetic field having a maximum gauss position (MGP) at an axial center of the magnetic field; and
   a magnet moving unit configured to move the horizontal magnet in a vertical direction,
   wherein the crucible is configured to move upward to maintain a position of a solid-liquid interface of the silicon melt at a predetermined height during growth of the single crystal ingot,
   wherein the magnet moving unit is configured to control movement of the horizontal magnet such that the MGP is positioned at 150 mm or more above the solid-liquid interface in the crucible during the growing of the single crystal ingot, and
   wherein the magnet moving unit is configured to control a rate of increase in a position of the MGP relative to the solid-liquid interface to be in a range of 3.5 mm/hr to 6.5 mm/hr when a solidification rate of the silicon melt accommodated in the crucible is 40% or less.

2. The apparatus for growing a single crystal ingot of claim 1, wherein the magnet moving unit controls a movement of the horizontal magnet in order to maintain an Oi deviation (stdev) in a horizontal cross-section of the single crystal ingot to 0.04 ppma or less.

3. The apparatus for growing a single crystal ingot of claim 1, wherein the magnet moving unit controls a movement of the horizontal magnet in order to maintain a BMD deviation (stdev of Log BMD) in a horizontal cross-section of the single crystal ingot to 0.063 ea/cm$^3$ or less.

4. The apparatus for growing a single crystal ingot of claim 1, wherein the magnet moving unit controls a movement of the horizontal magnet such that the rate of increase in the MGP is 0 when a solidification rate of the silicon melt contained in the crucible exceeds 40%.

5. A method for growing a single crystal ingot, comprising:

growing a single crystal ingot from a silicon melt in a crucible;

forming a magnetic field, with a horizontal magnet provided around the crucible, in a horizontal direction in the silicon melt in which the single crystal ingot is grown, the magnetic field having a maximum gauss position (MGP) at an axial center of the magnetic field;

moving the crucible upward to maintain a position of a solid-liquid interface of the silicon melt at a predetermined height during the growing of the single crystal ingot;

moving the horizontal magnet, with a magnet moving unit, in a vertical direction such that the MGP is positioned at 150 mm or more above the solid-liquid interface in the crucible during the growing of the single crystal ingot; and controlling, with the magnet moving unit, a rate of increase in a position of the MGP relative to the solid-liquid interface to be in the range of 3.5 mm/hr to 6.5 mm/hr when a solidification rate of the silicon melt accommodated in the crucible is 40% or less.

6. The method for growing a single crystal ingot of claim 5, wherein the moving the horizontal magnet comprises controlling the MGP in order to maintain an Oi deviation (stdev) in a horizontal cross-section of the single crystal ingot to 0.04 ppma or less.

7. The method for growing a single crystal ingot of claim 5, wherein the moving the horizontal magnet comprises controlling the MGP in order to maintain a BMD deviation (stdev of Log BMD) in a horizontal cross-section of the single crystal ingot to 0.063 ea/cm$^3$ or less.

* * * * *